United States Patent
Lakhani et al.

(10) Patent No.: US 7,154,782 B2
(45) Date of Patent: Dec. 26, 2006

(54) CONTIGUOUS BLOCK ADDRESSING SCHEME

(75) Inventors: Vinod Lakhani, Palo Alto, CA (US); Benjamin Louie, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/207,105

(22) Filed: Aug. 18, 2005

(65) Prior Publication Data

US 2005/0278481 A1 Dec. 15, 2005

Related U.S. Application Data

(62) Division of application No. 10/199,725, filed on Jul. 19, 2002.

(51) Int. Cl.
*G11C 11/00* (2006.01)

(52) U.S. Cl. ............ 365/185.09; 365/200; 365/230.01; 711/103

(58) Field of Classification Search ................ 711/106, 711/103; 365/185.09, 200, 230.01
See application file for complete search history.

(56) References Cited

U.S. PATENT DOCUMENTS

| | | | |
|---|---|---|---|
| 5,283,790 A | | 2/1994 | Kawashita |
| 5,742,934 A | * | 4/1998 | Shinohara ................... 711/103 |
| 5,925,138 A | | 7/1999 | Klein |
| 6,021,459 A | | 2/2000 | Norman et al. |
| 6,034,891 A | | 3/2000 | Norman |
| 6,055,611 A | | 4/2000 | Wright et al. |
| 6,081,463 A | * | 6/2000 | Shaffer et al. ............... 365/200 |
| 6,084,807 A | | 7/2000 | Choi |
| 6,175,891 B1 | | 1/2001 | Norman et al. |
| 6,246,615 B1 | | 6/2001 | King et al. |
| 6,504,768 B1 | | 1/2003 | Roohparvar et al. |
| 6,507,885 B1 | | 1/2003 | Lakhani et al. |
| 6,625,081 B1 | | 9/2003 | Roohparvar et al. |
| 6,671,775 B1 | * | 12/2003 | Park et al. ................... 711/112 |
| 6,766,409 B1 | | 7/2004 | Komatsu et al. |
| 2001/0003837 A1 | | 6/2001 | Norman et al. |
| 2001/0030897 A1 | | 10/2001 | King et al. |
| 2002/0012282 A1 | | 1/2002 | Saito et al. |
| 2002/0027264 A1 | | 3/2002 | Forbes et al. |
| 2002/0157048 A1 | | 10/2002 | Roohparvar |

FOREIGN PATENT DOCUMENTS

JP 403259460 A 11/1991

* cited by examiner

*Primary Examiner*—Matthew Kim
*Assistant Examiner*—Hetul Patel
(74) *Attorney, Agent, or Firm*—Leffert Jay & Polglaze, P.A.

(57) ABSTRACT

An improved non-volatile erase block memory device apparatus and method is described that incorporates an improved addressing scheme to provide for extended addressing allowing redundant erase blocks that are not utilized to repair general use erase blocks of the main memory array to be accessed and utilized as additional storage space by an end user. The additional storage space formed by the unused redundant erase blocks and the specified storage space of the main memory array is presented to the end user as a single contiguous address space. Additionally, the redundant erase blocks can be utilized to repair any damaged erase block in the memory array of the non-volatile erase block memory or Flash memory device regardless of bank placement.

17 Claims, 7 Drawing Sheets

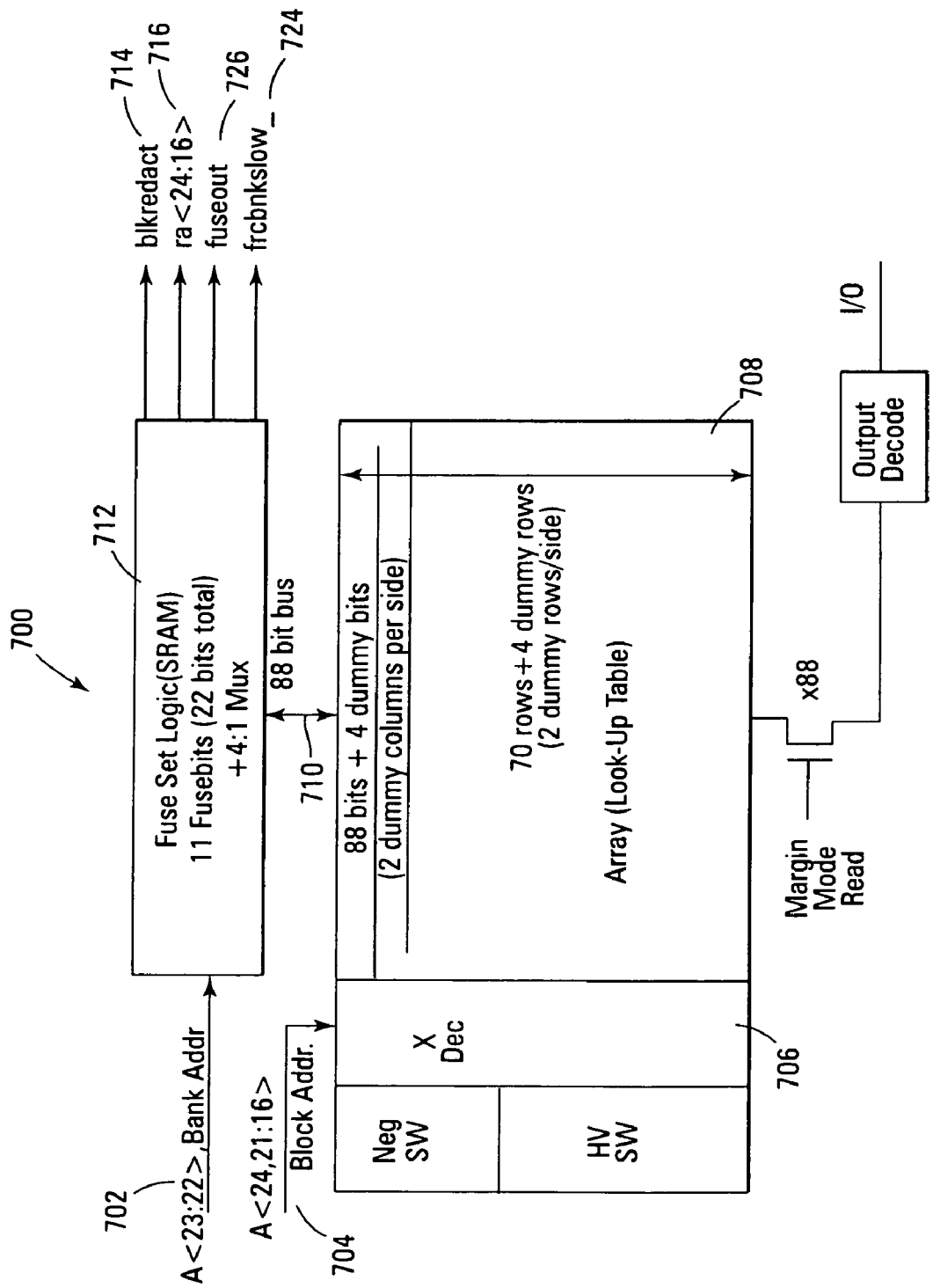

CONTIGUOUS BLOCK ADDRESSING SCHEME

RELATED APPLICATION

This is a divisional application of U.S. patent application Ser. No. 10/199,725, filed Jul. 19, 2002, titled "CONTIGUOUS BLOCK ADDRESSING SCHEME", which is commonly assigned, the entire contents of which are incorporated herein by reference.

TECHNICAL FIELD OF THE INVENTION

The present invention relates generally to integrated circuits and in particular the present invention relates to non-volatile memory circuits with block arrays.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks". Each of the cells within an erase block can be electrically programmed in a random basis by charging the floating gate. The charge can be removed from the floating gate by a block erase operation, wherein all floating gate memory cells in the erase block are erased in a single operation. For ease of access and management the erase blocks of a non-volatile memory device are typically arranged in "banks" or segments.

FIG. 1 shows a simplified diagram of a Flash memory 100 of the prior art. The Flash memory 100 has an address interface 104, a control interface 106, and a data interface 108. Internally to the Flash memory device a control state machine 110 directs internal operation of the Flash memory device; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116. Each bank 116 contains a series of erase blocks 118.

During use of a non-volatile erase block memory device, errors or faults commonly will appear in erase blocks. For this situation, additional erase blocks are typically associated with the memory array beyond the number that is necessary for the memory device to contain its specified data size. The additional extra erase blocks are then utilized by the non-volatile memory device for the replacement of erase blocks that become damaged or corrupted, thus ensuring the availability of the specified data storage during the expected lifetime of the non-volatile erase block memory device. These additional erase blocks are also known as redundant erase blocks or replacement erase blocks.

FIG. 2 shows a simplified block diagram of a redundant block control circuitry 200 and redundant erase blocks 202 of a Flash memory of the prior art. In FIG. 2, the redundant block control circuitry 200 is coupled to a number of redundant erase blocks 202 that are associated with each memory bank 204 (in the Flash memory of FIG. 2, 6 redundant erase blocks for each memory bank of 64 erase blocks). The redundant block control circuitry 200 contains a series of block fuse sets and SRAM latches (not shown) that each correspond to and activate a single redundant erase block 202 in a specific memory bank 204. When a general use erase block 206 of one of the main array banks 204 becomes damaged and must be replaced, an external controller or processor (not shown) operates the Flash memory control circuitry (not shown) to program a redundant block fuse set to replace the damaged main array erase block 206 with a redundant erase block 202. Afterwards, if an address is received at the Flash memory address interface (not shown) that addresses a damaged general use erase block 206, the programmed fuse set (not shown) disables the access to the general use erase block 206 in the main memory array bank 204 and activates its corresponding redundant erase block 202 in the memory array bank 204 for access via the redundant erase block select lines 208. The redundant erase blocks 202 are generally specific to a memory array bank 204 and can only be used to replace damaged erase blocks in that memory array bank. Therefore, a memory array bank 204 that accumulates more damaged general use erase blocks 206 than redundant replacement erase blocks 202 can no longer be repaired even though unused redundant erase blocks 202 exist in other memory array banks 204.

Because of this replacement erase block repair mechanism and the specificity of the redundant erase blocks to the memory banks, manufacturers must construct a much larger memory device and internal memory array banks than are necessary in order to guarantee a minimum available device size. Additionally, because they are not part of the main memory array addressing scheme, until the redundant erase blocks of a non-volatile erase block memory device are utilized in a repair they are unavailable for general use by the end user of the memory device even though they are present in the memory array.

For the reasons stated above, and for other reasons stated below which will become apparent to those skilled in the art upon reading and understanding the present specification, there is a need in the art for an improved non-volatile memory erase block addressing scheme.

SUMMARY OF THE INVENTION

The above-mentioned problems with operating, accessing, and manufacturing non-volatile erase block memory devices are addressed by the present invention and will be understood by reading and studying the following specification.

In one embodiment, a non-volatile memory comprises a memory array with a plurality of memory banks, each bank containing a plurality of general use erase blocks and a plurality of redundant erase blocks, an address interface, and a control circuit, wherein the control circuit maps the redundant erase blocks to replace damaged erase blocks in each bank and maps unutilized redundant erase blocks as available erase blocks to increase a usable size of the memory array.

In another embodiment, a non-volatile memory comprises a memory array containing a plurality of erase blocks arranged in a plurality of memory banks, wherein the memory array contains additional erase blocks in excess of those required for a minimum specified storage size of the memory array, an address interface, and a control circuit, wherein the control circuit maps the additional erase blocks to replace damaged erase blocks and maps unutilized additional erase blocks as available erase blocks to increase a usable size of the memory array beyond the minimum specified storage size of the memory array.

In yet another embodiment, a method of interfacing to an erase block memory array comprises accessing with an address interface an address range of a specified plurality of general use erase blocks of a non-volatile erase block memory device memory array of a specified size, and accessing with an extended address interface an extended address range of an unused additional erase blocks of a plurality of additional erase blocks of the non-volatile erase block memory device memory array.

In a further embodiment, a non-volatile erase block memory device interface comprises an address interface, wherein the address interface enables access to an address range of a specified plurality of erase blocks of a non-volatile erase block memory device memory array of a specified size, and an extended address interface, wherein the extended address interface enables access to an extended address range of a plurality of unused additional erase blocks of the non-volatile erase block memory device memory array.

In yet a further embodiment, a method of operating a Flash memory device comprises receiving an access to an erase block of a plurality of memory array segments each containing a plurality of general use erase blocks and a plurality of replacement erase blocks, redirecting the received access if it addresses a damaged erase block to a replacement erase block utilized to repair the damaged erase block from the plurality of replacement erase blocks of the plurality of memory array segments, accessing a general use erase block in a general use erase block address range if the received access addresses a general use erase block address, and accessing a replacement erase block in an extended address range if the received access addresses a replacement erase block in the extended address range, wherein the replacement erase block is not utilized to repair a damaged erase block.

In another embodiment, a method of operating a Flash memory device comprises receiving an access to an erase block of a memory array of a specified minimum storage size containing a plurality of general use erase blocks that have a cumulative storage space equal to that of the specified minimum storage size of the Flash memory device and a plurality of additional erase blocks, redirecting the received access if it addresses a damaged erase block to a selected additional erase block utilized to repair the damaged erase block from the plurality of additional erase blocks, accessing a general use erase block in a general use erase block address range if the received access addresses a general use erase block address, and accessing an additional erase block in an extended address range if the received access addresses an additional erase block in the extended address range, wherein the additional erase block is not utilized to repair a damaged erase block.

In yet another embodiment, a system comprises a processor, and a Flash memory coupled to the processor. The Flash memory includes a memory array with a plurality of memory banks, each bank containing a plurality of general use erase blocks and a plurality of redundant erase blocks, an address interface, and a control circuit, wherein the control circuit maps the redundant erase blocks to replace damaged erase blocks in each bank and maps unutilized redundant erase blocks as available erase blocks to increase a usable size of the memory array.

In a further embodiment, a system comprises a processor, and a Flash memory coupled to the processor. The Flash memory includes a memory array containing a plurality of erase blocks arranged in a plurality of memory banks, wherein the memory array contains additional erase blocks in excess of those required for a minimum specified storage size of the memory array, an address interface, and a control circuit, wherein the control circuit maps the additional erase blocks to replace damaged erase blocks and maps the unutilized additional erase blocks as available erase blocks to increase the usable size of the memory array beyond the minimum specified storage size of the memory array.

In yet a further embodiment, an erase block memory array control circuit comprises an address interface that has a conventional address interface and an extended address interface, a decode circuit coupled an output of the address interface and coupled to a look up table, and a fuse set logic circuit coupled to an output of the look up table and having a plurality of erase block memory array control outputs, wherein the address interface expresses an address to the decode circuit which selects an entry from a plurality of redirect entries in the look up table, and wherein the selected redirect entry from the look up table is utilized by the fuse set logic circuit to allow the expressed address to access a general use erase block, or disable the access to the general use erase block and re-map the expressed address to an additional erase block utilized to repair the general use erase block.

In another embodiment, an extended access contiguous address space Flash memory comprises a memory array with a plurality of floating gate memory cells arranged in a plurality of memory banks, each bank arranged in a plurality of erase blocks, wherein each bank contains a plurality of general use erase blocks addressed by a general use erase block erase block address bus coupled to a general use erase block decode circuit and a plurality of additional redundant erase blocks that are in excess of those required for the specified storage size of the memory bank, where the plurality of additional redundant erase blocks are addressed by a redundant erase block address bus, an address interface coupled to the general use erase block address decode circuit, and a control circuit coupled to the address interface and the general use erase block address decode circuit, wherein the control circuit maps the additional erase blocks to replace damaged erase blocks in each bank and maps the unutilized redundant erase blocks as available erase blocks. The control circuit includes a decode circuit coupled an output of the address interface and coupled to a look up table, a fuse set logic circuit coupled to an output of the look up table and having a plurality of erase block memory array control outputs, wherein the address interface expresses an address to the decode circuit which selects an entry from a plurality of redirect entries in the look up table, and wherein the selected redirect entry from the look up table is utilized by the fuse set logic circuit to allow the expressed address to access a general use erase block, or disable the access to the general use erase block and re-map the expressed address to a redundant erase block utilized to replace the general use erase block via the redundant erase block address bus, and a redundant block decode circuit coupled the output of the address interface and the redundant erase block address bus, wherein the redundant block decode circuit addresses an extended erase block range composed of unutilized redundant erase blocks via the redundant erase block address bus as general use erase blocks when an extended address is expressed on the address interface.

In yet another embodiment, an extended access contiguous address space Flash memory comprises a memory array with a plurality of floating gate memory cells arranged in a plurality of memory banks, each bank arranged in a plurality of erase blocks addressed by an erase block address bus that is coupled to an address decode circuit, wherein each bank contains additional erase blocks in excess of those required for the specified size of the memory bank, an address interface coupled to the address decode circuit, and a control circuit coupled to the address interface and the address decode circuit, wherein the control circuit maps the additional erase blocks to replace damaged erase blocks in each bank and maps the unutilized additional erase blocks as available erase blocks. The control circuit includes a look up table decode circuit coupled an output of the address interface and coupled to a look up table, and a fuse set logic circuit coupled to an output of the look up table and having a plurality of erase block memory array control outputs, wherein the address interface expresses an address to the decode circuit which selects an entry from a plurality of entries in the look up table, and wherein the selected entry from the look up table is utilized by the fuse set logic circuit to allow the expressed address to access a general use erase block, or re-map the expressed address to an alternative erase block utilized to replace a damaged erase block.

In a further embodiment, a method of addressing erase blocks in an erase block memory device comprises mapping an address to an erase block of a plurality of erase blocks in a memory array, re-mapping an address to a damaged erase block of the plurality of erase blocks to an available replacement erase block of a plurality of replacement erase blocks, and mapping any unused replacement erase blocks of the plurality of replacement erase blocks as additional erase blocks available for use as part of the plurality of erase blocks of the memory array.

In yet a further embodiment, a memory comprises an X number of memory cells, a Y number of unused redundant memory cells, a first address connection to address the X number of memory cells, a second address connection to address the Y number of unused memory cells to allow general use of the X+Y cells.

Other embodiments are described and claimed.

BRIEF DESCRIPTION OF THE DRAWINGS

FIGS. 6 and 7 are simplified diagrams of redundant block control circuitry of Flash memories of the present invention.

DETAILED DESCRIPTION OF THE INVENTION

Figure 1:
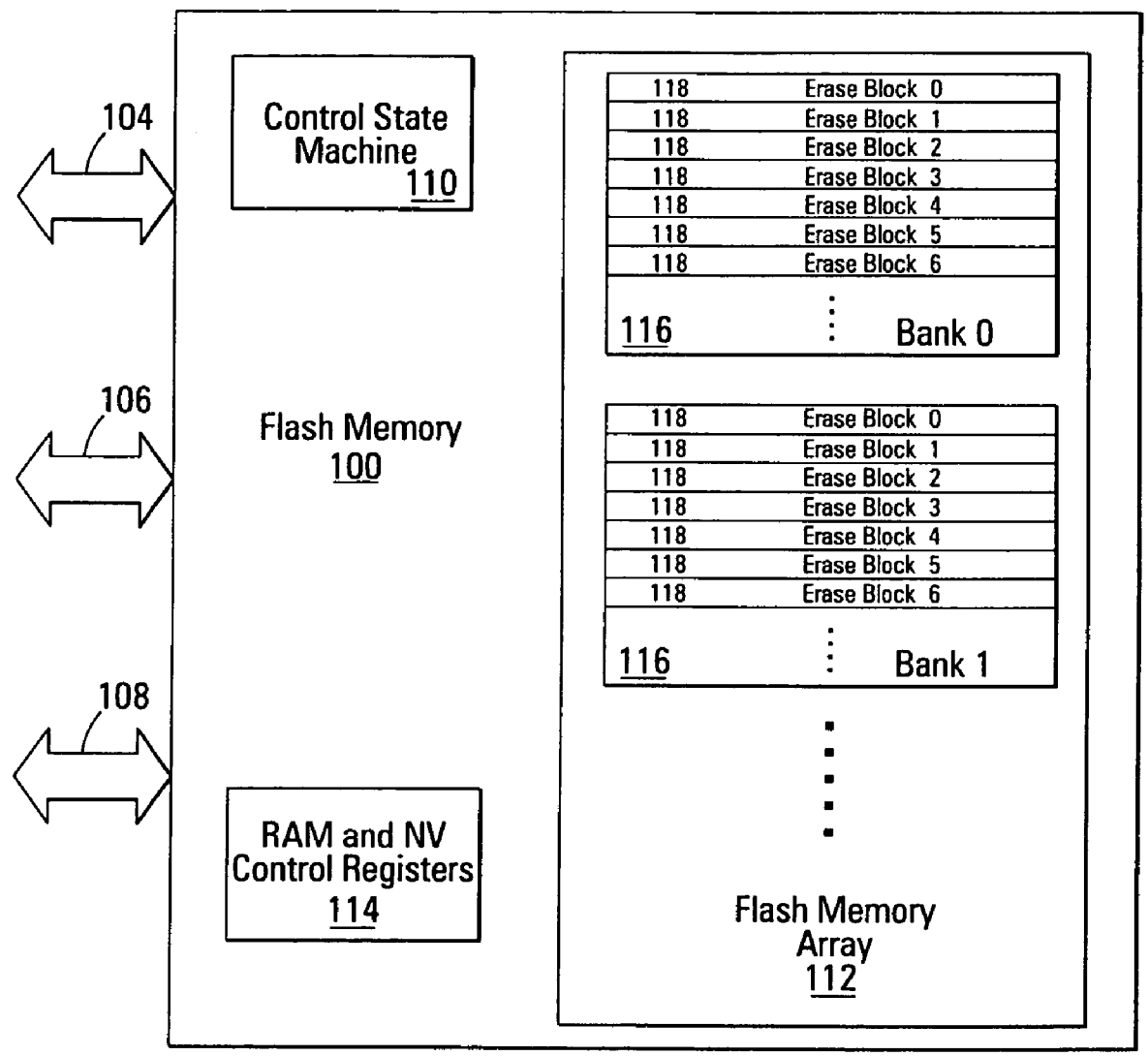
FIG. 1 is a simplified diagram of a Flash memory device of the prior art.
Figure 2:
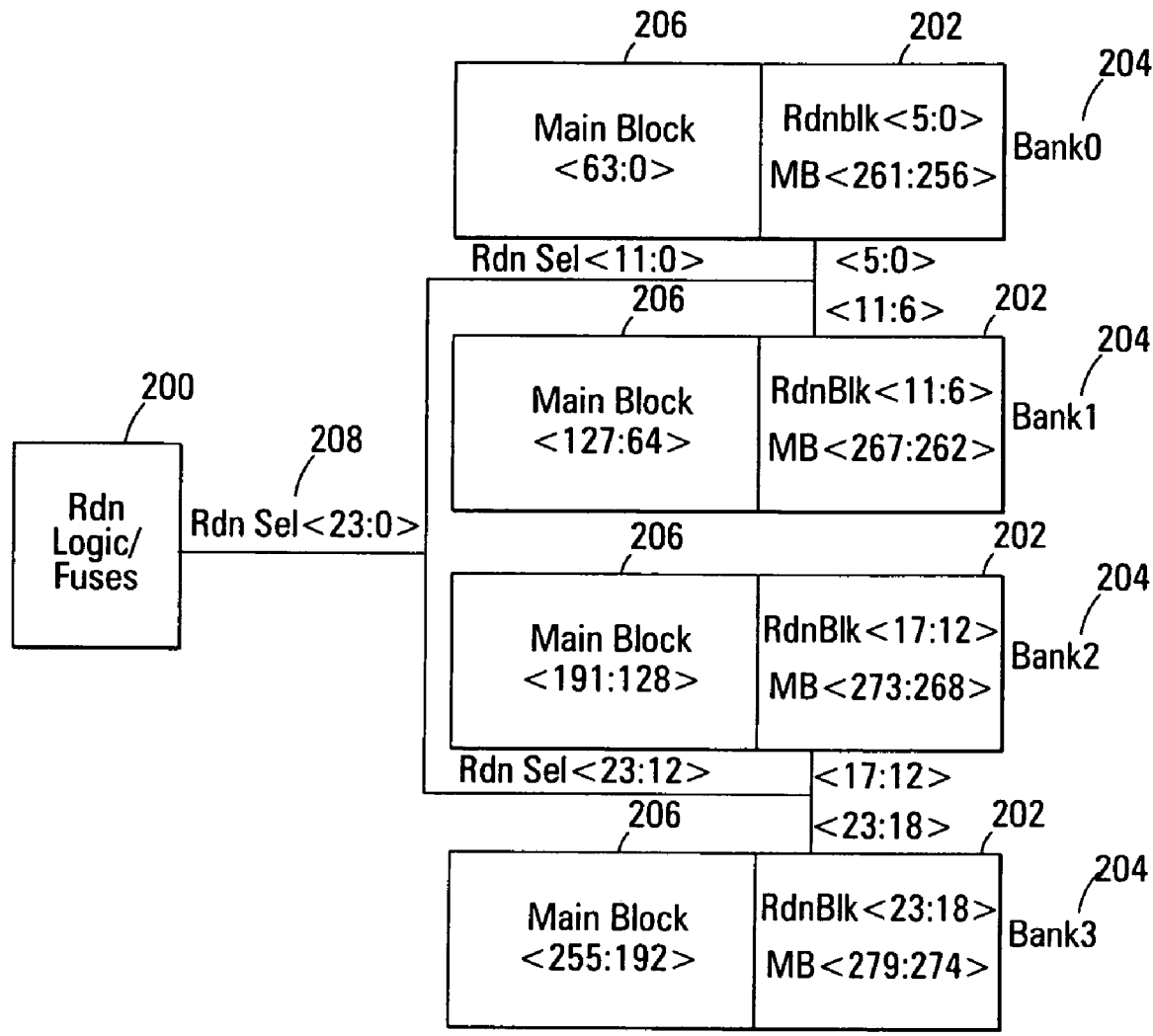
FIG. 2 is a simplified diagram of a redundant block control circuitry and redundant erase blocks of a Flash memory device of the prior art.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

To deal with the above detailed issues of a manufacturer having to construct a much larger memory device than are necessary in order to guarantee a minimum available device size and having those unused redundant erase blocks unavailable for general use by the end user of the memory device, a Flash memory of the present invention has an improved redundant erase block control circuit that allows extended access by the end user to the unutilized redundant erase blocks. Embodiments of the present invention with the improved redundant erase block control circuit and addressing scheme can also present the general use erase blocks and redundant erase blocks as a contiguous usable memory array to the end user of the device that is larger than the specified device size. Additionally, Flash memories of the present invention allow for the use of erase blocks to repair or replace damaged erase blocks without regard to the memory bank the erase block is located in or the bank location of the damaged erase block being replaced.

As stated above, current non-volatile memory erase block addressing and redundant erase block control schemes do not allow addressing of or access to unused redundant erase blocks. This has the effect of leaving these redundant erase blocks behind and unused if they are not utilized to repair or replace defective main memory array blocks. As stated above, these non-volatile memory erase block devices typically utilize a series of fuse set circuits that are each associated with a single redundant erase block to repair defective general use erase blocks of the main memory array. When a main memory array general use erase block is noted as defective a fuse set circuit and associated redundant erase block is programmed to replace it. The selected redundant erase block is usually constrained to be in the same bank as the defective erase block. Because of this redundant erase blocks cannot be utilized to repair damaged or defective erase blocks in banks that they are not a component of. Subsequent memory accesses to an address in the defective general use erase block are matched by the value programmed into the control fuse set for the redundant erase block used to repair it. The fuse set, when it detects an address match for the erase block it has been programmed to replace, disables the access to the defective erase block and selects and activates its associated redundant erase block in its stead. An additional problem with this scheme is that if a memory array bank accumulates too many defective erase blocks and runs out of replacement redundant erase blocks the bank cannot be repaired even though other banks have available redundant erase blocks. This can render the Flash memory unusable or lead to gaps in the contiguous sequence of erase blocks that the memory presents to the outside world.

Figure 3:
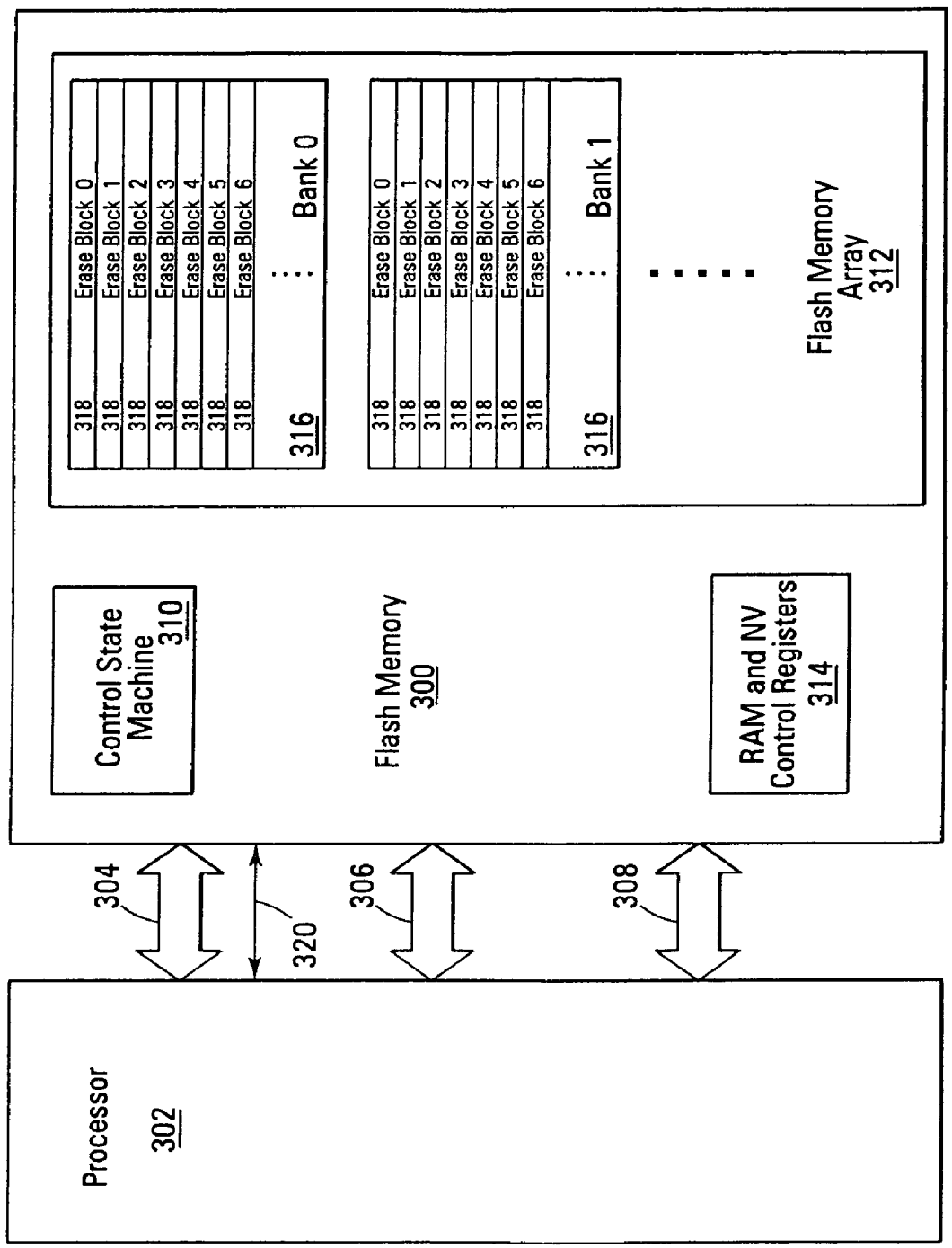
FIG. 3 is a simplified diagram of a Flash memory of the present invention.

FIG. 3 is a simplified diagram of a Flash memory device embodiment of the present invention 300 coupled to a processor 302 with an address 304, control 306, data bus 308, and an extended address bus 320. Internal to the Flash memory device a control state machine 310 directs operation of the Flash memory device; managing the Flash memory array 312 and updating RAM control registers and non-volatile erase block management registers 314. The RAM control registers and tables 314 are utilized by the control state machine 310 during operation of the Flash memory 300. The Flash memory array 312 contains a sequence of memory banks or segments 316. Each bank 316 contains a series of general use erase blocks 318. In the embodiment of FIG. 3, the Flash memory device 300 contains a memory array 312 of 4 banks 316 (bank 3:bank 0), each bank 316 contains 64 erase blocks 318 and 6 redundant erase blocks (not shown). The Flash memory device 300 is addressed by an address interface 304 containing address lines <A23:A0> that enables access to the general use erase blocks 318 of the array banks 316. Individual memory array bank and erase block addressing within the 4 banks of 64 erase blocks each is accomplished with address lines <A23:A16>. Memory addresses within an individual erase block are addressed with address lines <A15:A0>. An extended address interface 320, that consists of address line <A24>, enables access to the additional 6 (24 total) redundant erase blocks (not shown in FIG. 3) of each memory array bank 316. It is noted that other Flash memory array bank and erase block arrangements are possible and should be apparent to those skilled in the art with the benefit of this disclosure.

Conventional Flash memory fuse sets may be extended in embodiments of the present invention to allow addressing of the redundant erase blocks with the extended address interface. However, this would not allow the Flash memory to replace damaged erase blocks from differing memory banks. Alternative approaches to the issue of damaged erase block replacement with an available redundant erase block that are utilized in embodiments of the present invention and do not have the problem of current fuse set circuits in replacing defective erase blocks across array banks are described in U.S. patent application Ser. No. 10/184,961, titled "A Repairable Block Redundancy Scheme", which is commonly assigned and incorporated herein by reference.

Figure 4:
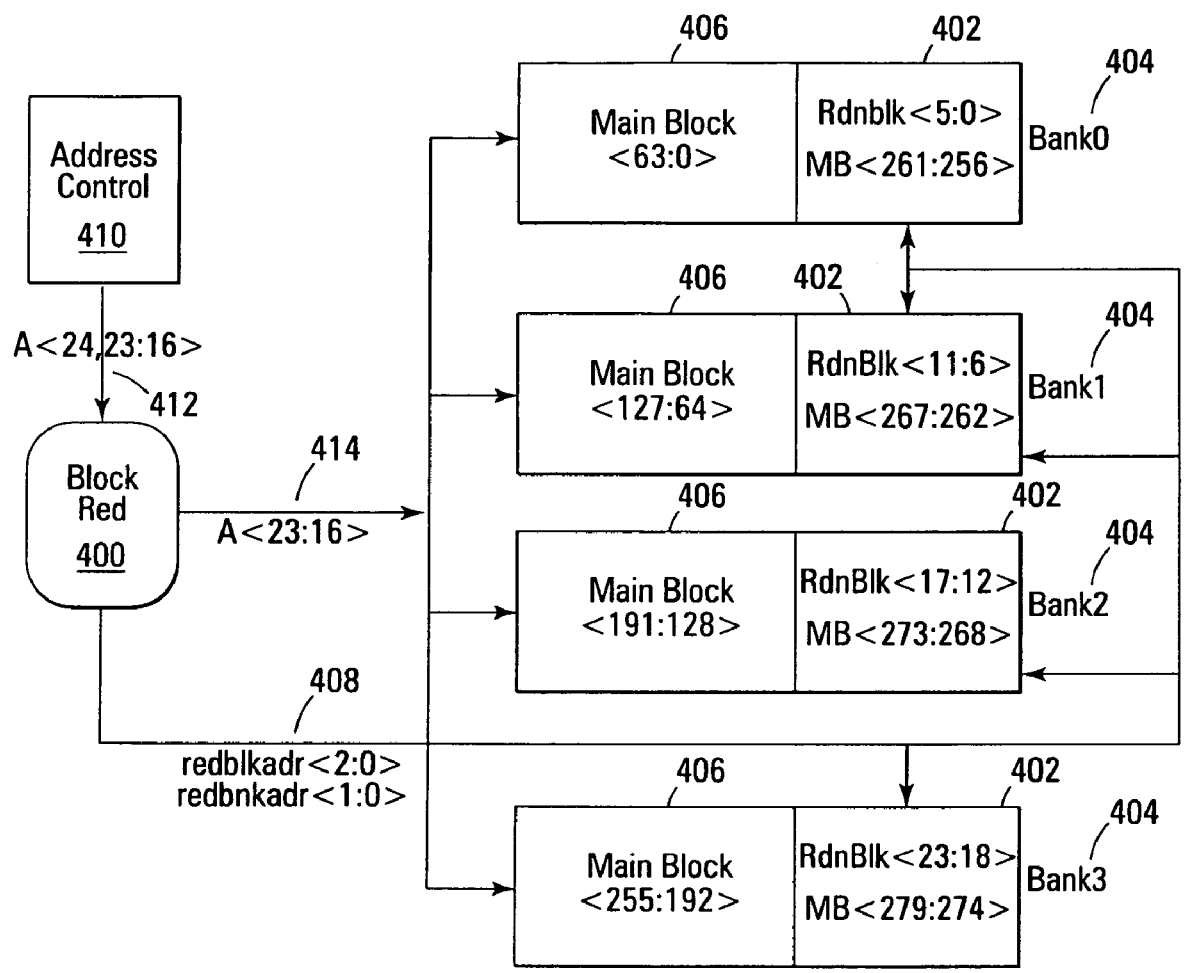
FIGS. 4 and 5 are simplified diagrams of redundant block control circuitry and redundant erase blocks of Flash memories of the present invention.

FIG. 4 is a simplified diagram of a Flash memory embodiment of the present invention with redundant block control circuitry 400 (also known as redirect control circuitry) and redundant erase blocks 402. The Flash memory embodiment detailed in FIG. 4 contains four memory array banks 404 (bank 3:bank0) of 64 general use erase blocks 406 each for an available memory array of 256 erase blocks. Each memory array bank 404 also contains 6 redundant erase blocks 402. An address control circuit 410 (incorporating the address interface and the extended address interface, not shown) is coupled 412 to a redundant block control circuit 400 to allow addressing of individual erase blocks in the memory array. The redundant block control circuit 400 is coupled to each of the memory array banks 404 via a general memory array erase block address bus 414. The redundant block control circuit 400 is also coupled to a number of redundant erase blocks 402 that are associated with each memory bank 404 via an independent redundant block address bus 408.

When a request to access an undamaged general use erase block 406 is received at the Flash memory address control 410 via an address interface (not shown), the redundant block control circuitry 400 evaluates the request and enables the access to the general use erase block 406 in the main memory array bank 404 via the general memory array erase block address bus 414.

If a general use erase block 406 of one of the main array banks 404 becomes damaged and must be replaced an external processor or control circuit operates the Flash memory control circuitry (not shown) to program the redundant block control circuit 400 to replace the defective main array erase block 406 with a redundant erase block 402. Afterwards, if an address is received at the Flash memory address control 410 via the address interface (not shown) that matches an address of a replaced defective general use erase block 406, the redundant block control circuitry 400 disables the access to the general use erase block 406 in the main memory array bank 404 and activates the corresponding redundant erase block 402 for access via the redundant erase block address bus 408.

When a request to access a memory array erase block that is beyond the normal address space of the memory array (<A23:A16>) occurs, by the receipt of an address utilizing the extended address interface (<A24>, in the Flash memory of FIG. 4), the redundant block control circuit 400 converts the address to a corresponding redundant block and bank address (rdnblock<2:0> and rdnbank<1:0>) and activates the requested redundant erase block 402 in the appropriate memory bank 404, allowing them to be accessed and thereby "reclaimed" for use. If the redundant erase block being addressed is in use as a replacement for a defective general use erase block 406 the redundant block control circuit 400 will shut off all block addresses and prevent any block from being addressed. This prevents any accidental accessing of the same block with two different addresses.

With a mapping of the reclaimed redundant erase blocks (24 blocks) to addresses after the main memory array address range of 256 blocks, the addition of the reclaimed redundant erase blocks give an available block address range of 280 total (erase blocks 0:279). However, with a standard redundant erase block use scheme approach, if a random redundant erase block is chosen to repair a main memory array erase block, undesirable gaps may appear in the extended address range if an improved redundant block repair scheme is not utilized.

As the repair ability of redundant erase blocks 402 in embodiments of the present invention are not specific to the memory array bank 404 being addressed by the access, if a memory array bank 404 accumulates more defective general use erase blocks 406 than redundant replacement erase blocks 402 it can be repaired with unused redundant erase blocks 402 from other memory array banks 404. This allows a redundant erase block repair scheme that utilizes the most significant addressed redundant erase block and therefore allows for an overall contiguous erase block address scheme to be maintained without gaps in the address range of both the main memory array (256 blocks) and reclaimed redundant erase blocks (24 blocks). If a redundant erase block is required to repair a main memory array erase block the most significant addressed redundant erase block is utilized in the repair, decreasing the address range by one. Any additional repairs further decrease the range of available erase blocks in turn as redundant erase blocks are utilized. Any user information stored in the redundant erase block that is used for a repair should be move before the block is used in a repair or risk being lost.

Figure 5:
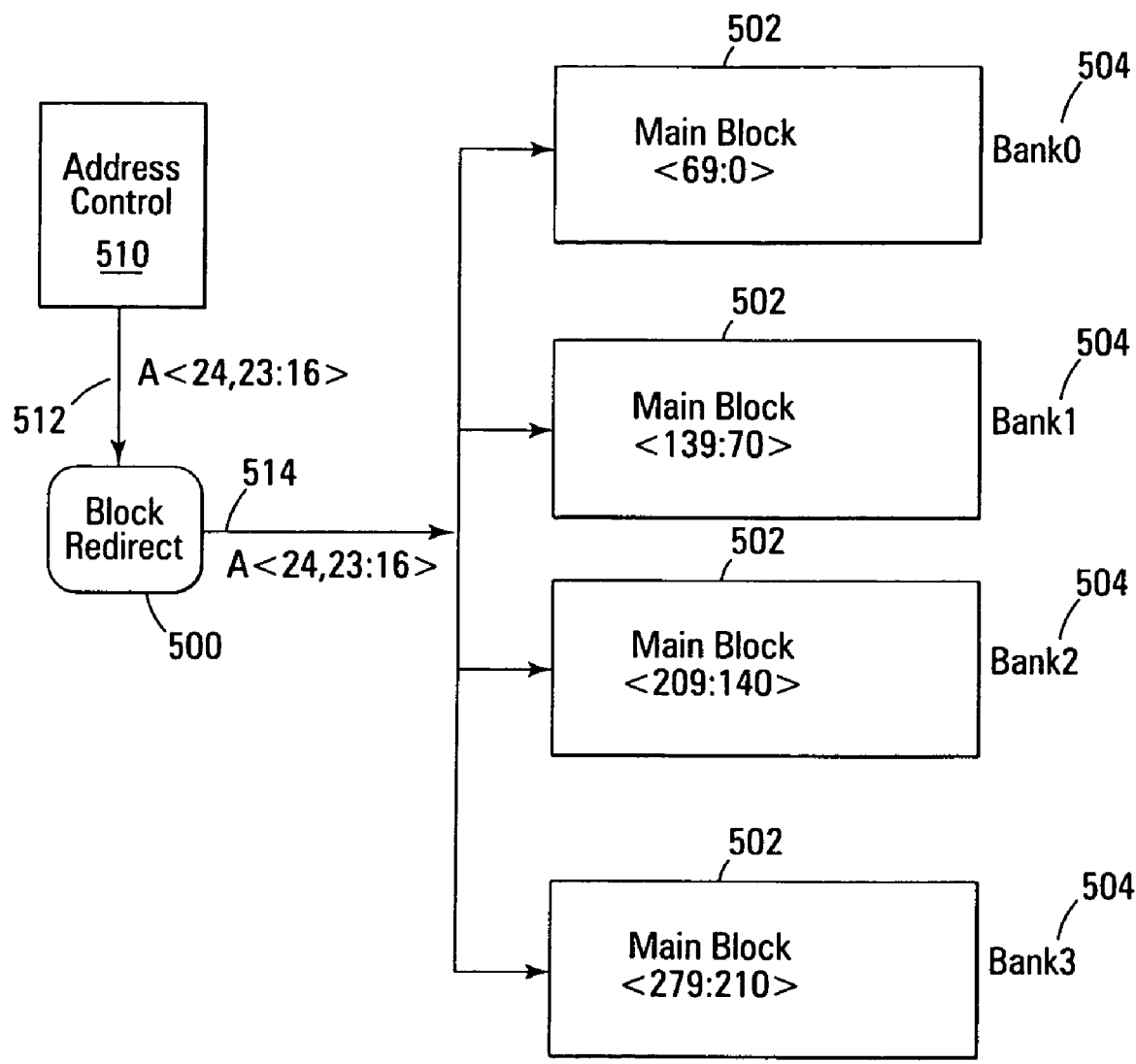

FIG. 5 is a simplified diagram of an alternative embodiment of the present invention. In FIG. 5 we can see that with embodiments of the present invention which utilize redundant erase block control circuits that allow full re-mapping of any erase block in the memory array we do not necessarily have to separate the redundant erase blocks from the general use erase blocks in the memory banks of the main erase block array. The alternative redundant erase block control circuit's ability to remap and repurpose any erase block in the memory array to any other erase block address and bank allows us to simply merge the redundant erase blocks with the general use erase blocks of the main memory banks and address the unified erase block banks as a composite whole, remapping erase blocks as they become damaged or needed elsewhere.

In FIG. 5, a Flash memory embodiment of the present invention is shown with redundant block control circuitry 500 and a series of merged memory array banks 504 containing both general use and redundant erase blocks that are merged into uniform erase block arrays 502 where all contained erase blocks are available for general use. For example purposes, the Flash memory embodiment detailed in FIG. 5 again contains four memory array banks 504 (bank 3:bank0) which each contain 64 general use erase blocks and 6 extra "redundant" erase blocks for a total of 70 generally addressable erase blocks in each memory array bank 504 (bank 0 <main blocks 69:0>, bank 1 <main blocks 138:70>, bank 2 <main blocks 209:140>, bank 3 <main blocks 279:210>). This results in a specified Flash memory device array size of up to 280 erase blocks, if there are no defective erase blocks.

In FIG. 5, an address control circuit 510 (not shown) incorporating the address interface and the extended address interface is coupled 512 to a redundant block control circuit 500 to allow addressing of individual erase blocks in the memory array. The redundant block control circuit 500 is coupled to each of the memory array banks 504 via a general memory array erase block address bus 514 to allow addressing of the merged memory array banks 504 each containing both redundant erase blocks and general use erase blocks. This approach eliminates the need for an independent redundant block address bus and select circuitry.

When an erase block becomes defective in the Flash memory embodiment of the present invention of FIG. 5, the Flash memory control circuitry (not shown) programs the redundant block control circuit 500 to replace the damaged erase block with another undamaged erase block. As the general use erase blocks and redundant erase blocks are merged together in memory array banks of the Flash memory of FIG. 5 the redundant erase block circuit 500 is simply programmed to replace the defective erase block with another erase block that has been selected to use as a replacement. Afterwards, if an address is received at the Flash memory address control 510 via an address interface (not shown) that addresses a damaged memory array erase block 502, the redundant block control circuitry 500 disables the access to the addressed erase block 502 in the main memory array bank 504 and activates the corresponding selected replacement erase block 502 for access via the redundant erase block address bus 408. In this manner the redundant erase block control circuit 500 can re-map and repair any defective erase block 502 with any other erase block 502, allowing repair to occur even in what would normally be the extended range of redundant erase blocks. If the erase block 502 being addressed is in use as a replacement for a defective erase block 502 the redundant block control circuit 500 will shut off all block addresses and prevent any block from being addressed. This prevents any accidental accessing of the same block with two different addresses.

During an access to a undamaged erase block 502, an address is received at the Flash memory address control 510 via the address interface (not shown), the redundant block control circuitry 500 evaluates the request and enables the access to the general use erase block 502 in the main memory array bank 504 via the memory array address bus 514.

When a request to access a memory array erase block that is beyond the normal address space of the memory array (<A23:A16>) occurs, by receiving of an address utilizing the extended address interface (<A24> in the Flash memory of FIG. 5), the redundant block control circuit 500 converts the address to a corresponding block address in the erase block range <main block 257:280> and activates the requested erase block 502 in the appropriate memory bank 504.

As the usability of erase blocks 502 are not specific to the memory array bank 504 being addressed by the access in the Flash memory of FIG. 5, if a memory array bank 504 accumulates defective erase blocks 502 it can be repaired with erase blocks 502 from other memory array banks 504. This allows the use of erase block replacement schemes that are not constrained by the structure of the memory device or its internal bank structure.

An erase block replacement scheme that is used by one embodiment of the present invention with merged erase block memory banks utilizes the most significant addressed redundant erase block of the memory array to repair a damaged erase block. This allows for an overall contiguous erase block address scheme to be maintained without gaps in the address range of the memory array. Thus making available main block addresses of up to 280 (erase blocks 0:279), if the device has no block repairs. If an erase block is required to repair a damaged erase block, the most significant addressed erase block is utilized in the repair, decreasing the overall address range by one. Any additional repairs further decrease the range of available erase blocks in turn. Any user information stored in the most significant addressed erase block when it is used for a repair should be moved before the block is used in the repair or risk being lost.

It is noted that other memory bank arrangements, array arrangements, and block replacement schemes are possible with merged general use and redundant erase block array embodiments of the present invention and will be apparent to those skilled in the art with the benefit of the present invention.

Figure 6:
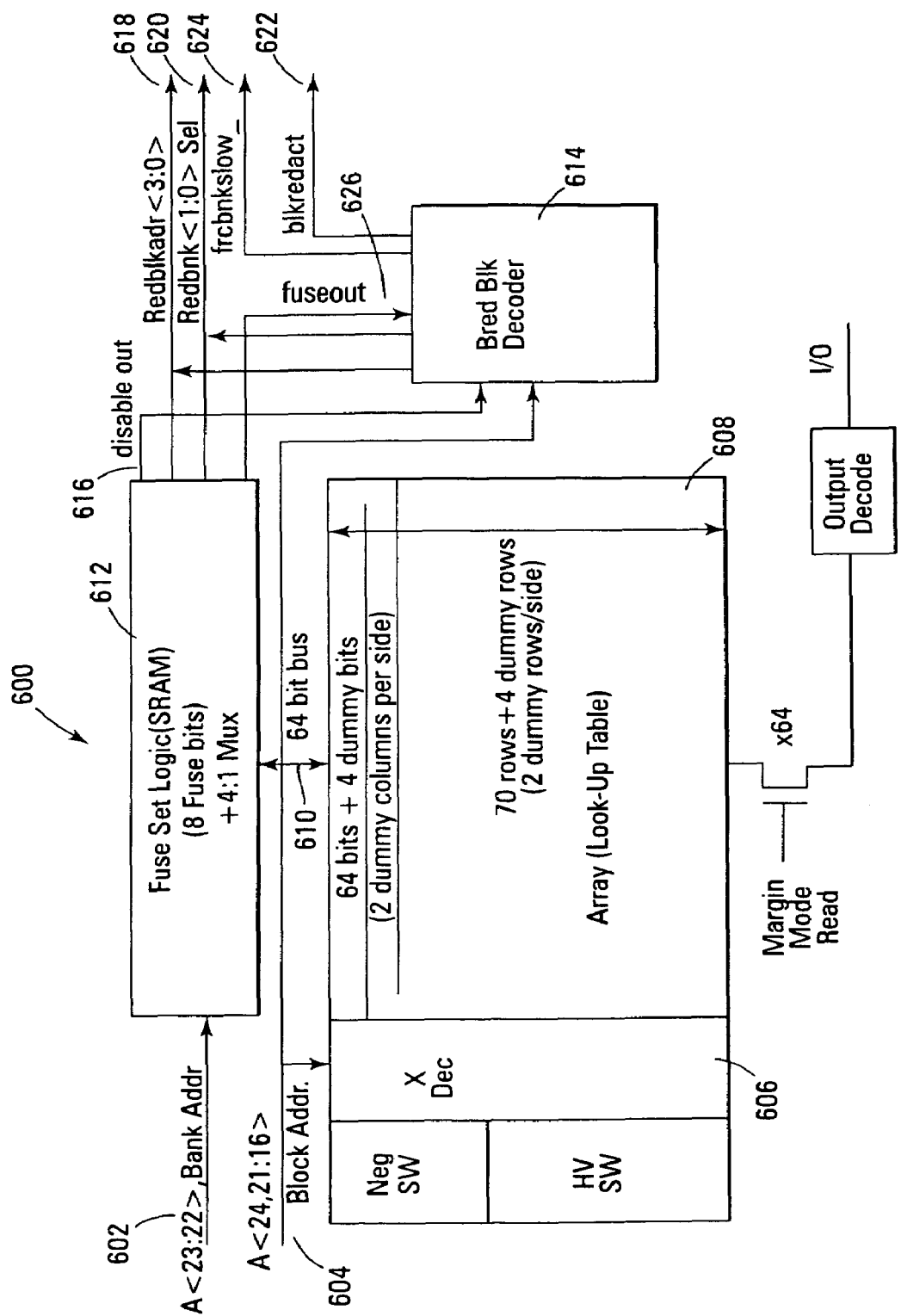

FIG. 6 is a simplified diagram of a redundant block control circuit 600 such as utilized with the Flash memory of FIG. 4. The redundant block control circuit 600 of FIG. 6 is detailed in the alternative approaches to conventional fuse set circuits and the issue of damaged erase block replacement described in the incorporated reference, titled "A Repairable Block Redundancy Scheme". As such, the following description describes an overview of circuit features and functions with an emphasis on circuit implementation differences.

In the redundant block control circuit 600 of FIG. 6, the requested address is input from the address interface (not shown) and is separated into a bank address 602 <A23:A22> that selects one of the four banks and a block address 604 that also incorporates the extended address interface address line(s) <A24, A21:A16> (address lines <A15:A0> that select the requested data from the selected erase block are routed separately). The block address 604 is coupled to a decoder 606 that selects a row from a look up table 608 which contains a block redirect information entry for each erase block in the main Flash memory array (not shown). For a 256 conventionally addressed main array erase block Flash memory (280 total erase blocks with extended addressing), the look up table array 608 contains 70 rows (the number of blocks per bank plus the number of spare blocks per bank: 64 general use+6 redundant=70 actively utilized rows, plus 4 dummy rows for testing) of 64 bits (plus 4 dummy bits for testing) each. Each row contains redirect information for 4 erase blocks (the number of banks) of 8 bits each (each complementarily encoded in a space of 16 bits). The information from the selected row is coupled to a fuse set logic 612 via a 64 bit bus 610. The bank address 602 is coupled to the fuse set logic 612 and selects one of the 4 erase block redirect information sections from the selected look up table row and loads it into internal SRAM latches (not shown) in the fuse set logic 612. The selected 8 bits use 4 bits to encode the associated redundant block address used, 2 bits to encode the bank that the redundant block is in, 1 bit for an enable, and 1 bit for a disable.

If the encoded redirect from the look up table 608 is not enabled (the enable bit not set), the fuse set logic 612 allows the normal erase block address and access to continue unchanged by the normal block addressing decode circuitry (not shown). If the encoded redirect from the look up table 608 is enabled (the enable bit set and the disable bit not set), the fuse set logic 612 indicates an erase block redirect action by outputting a fuseout signal 626 and disables the normal erase block access. The fuse set logic then redirects the access by outputting the encoded redundant erase block address on the redundant erase block address bus 618 (Redblkadr<3:0>) and the redundant erase block bank select bus 620 (Redbnk<1:0>) selecting the indicated redundant erase block for access with the frcbnkslow_624 signal (active low).

When an extended address (including A24) is received by the address interface (not shown) the block address 604 is coupled to look up table decoder 606 and to the redundant block decoder 614. The look up table decoder 606 selects a row from the lookup table and loads it into the fuse set logic 612, which selects the 8 bits that represent the addressed redundant erase block based on the input of the bank address 602 as detailed above. If the encoded redirect from the look up table 608 is not enabled (the enable bit not set), the fuse set logic 612 allows the extended address erase block access to continue by having the redundant block decoder 614 select the indicated redundant erase block for access by outputting the decoded redundant erase block address on the redundant erase block address bus 618 (Redblkadr<3:0>) and the redundant erase block bank select bus 620 (Redbnk<1:0>) and accessing them with the frcbnkslow_624 signal (active low).

If the encoded redirect from the look up table 608 is enabled (the requested redundant erase block is damaged and has been repaired), the enable bit is set and the disable bit is not set. The fuse set logic 612 indicates an erase block redirect action by outputting a fuseset signal 626 that disables the extended erase block access of the redundant block decoder 614. The fuse set logic then redirects the access by outputting the encoded redundant erase block address on the redundant erase block address bus 618 (Redblkadr<3:0>) and the redundant erase block bank select bus 620 (Redbnk<1:0>) selecting the indicated redundant erase block for access with the frcbnkslow_624 signal (active low).

If the requested redundant erase block has been utilized to repair another defective erase block, the look up table 608 will return information that indicates that the erase block is disabled (disable bit is set) causing the fuse set logic 612 to output a disable signal 616. In this situation the fuse set logic will not output a corresponding redundant erase block address on the redundant erase block address bus 618 (Redblkadr<3:0>) and the redundant erase block bank select bus 620 (Redbnk<1:0>). The disable signal 616 will also disable the redundant block decoder 614. These actions effectively block all access, preventing inadvertent accessing of an erase block through two addresses. It is noted that any erase block in the Flash memory, and not just redundant erase blocks, can be so disabled by an appropriate entry in the look up table 608.

The redundant block control circuit 600 of FIG. 6 differs slightly in implementation from the incorporated reference to allow access into the extended address range of the reclaimed redundant erase blocks beyond the 256 erase block addresses of the main array. The look up table 608 incorporates 6 additional rows (70 rows instead of a comparable 64 rows) to include redirect information (disabling of access to prevent inadvertent access to a block used for a repair and repair block redirect information for a block that was repaired) for the now 24 addressable redundant erase blocks enabled by the addition of extended addressing (<A24>) that the decoder 606 has also been modified to incorporate, allowing selection of the extended table rows. The redundant block control circuit 600 of FIG. 6 also includes a redundant block decoder 614 to decode the extended block address <A24, A23:A16> and access the selected redundant erase block, if it is not disabled or redirected by the fuse set logic 612 and look up table 608.

FIG. 7 is a simplified diagram of a redundant block control circuit 700 such as utilized with a Flash memory with merged memory array banks as that of FIG. 5. The redundant block control circuit 700 of FIG. 7 is also detailed in the alternative approaches to conventional fuse set circuits and the issue of damaged erase block replacement described in the incorporated reference, titled "A Repairable Block Redundancy Scheme". As such, the following description describes an overview of circuit features and functions with an emphasis on circuit implementation differences.

In the redundant block control circuit 700 of FIG. 7, the requested address is input from the address interface (not shown) and is separated into a bank address 702 <A23:A22> that selects one of the four banks and a block address 704 that also incorporates the extended address interface address line(s) <A24, A21:A16> (address lines <A15:A0> that select the requested data from the selected erase block are routed separately). The block address 704 is coupled to a decoder 706 that selects a row from a look up table 708 which contains a block redirect information entry for each erase block in the main Flash memory array (not shown). For a 256 conventionally addressed main array erase block Flash memory (280 total erase blocks with extended addressing), the look up table array 708 contains 70 rows (the number of blocks per bank: 70 general use erase blocks per bank=70 actively utilized rows, plus 4 dummy rows for testing) of 88 bits (plus 4 dummy bits for testing) each. Each row contains 4 groups of redirect information that correspond to 4 erase blocks. Each group of redirect information contains an absolute block address (9 bits), an enable bit, and a disable bit (for 11 bits in the redundant control circuit 700 of FIG. 7 each, complementarily encoded in a space of 22 bits). The information from the selected row is coupled to a fuse set logic 712 via a 88 bit bus 710. The bank address 702 is coupled to the fuse set logic 712 and selects one of the 4 erase block redirect information sections from the selected look up table row and loads it into internal SRAM latches (not shown) in the fuse set logic 712.

If the encoded redirect from the look up table 708 is not enabled (the enable bit not set), the fuse set logic 712 allows the normal erase block access to continue via the input address. If the encoded redirect from the look up table 708 is enabled (the enable bit set and the disable bit not set). The fuse set logic 712 indicates an erase block redirect action by outputting an enable signal 714 (also known as a block redirect action) and disables the normal erase block access. The fuse set logic then redirects the access by outputting the encoded absolute redirect erase block address on the redirect erase block address bus 716 (ra<24:16>) selecting the indicated erase block for access as a replacement.

When an extended address (including A24) is received by the address interface (not shown), the extended block address 704 is coupled to look up table decoder 706 as with a normal address access described above. The look up table decoder 706 selects a row from the lookup table and loads it into the fuse set logic 712, which selects the 11 bits that represent the addressed erase block based on the input of the bank address 702 as detailed above. If the encoded redirect from the look up table 708 is not enabled (the enable bit not set), the fuse set logic 712 allows the extended address erase block access to continue unchanged by the normal block addressing decode circuitry (not shown). If the encoded redirect from the look up table 708 is enabled (the requested extended address erase block is damaged and has been repaired; the enable bit is set and the disable bit is not set), the fuse set logic 712 indicates an erase block redirect action by outputting an enable signal 714 (redirect action) that disables the extended erase block access. The fuse set logic then redirects the access by outputting the encoded absolute erase block address on the redirect erase block address bus 716 (ra<24:16>) and selecting the indicated replacement erase block for access.

If the requested erase block has been utilized to repair or replace another defective erase block, the look up table 708 will return information that indicates that the erase block is disabled (disable bit is set) causing the fuse set logic 712 not to output a redirect enable signal 714, disabling the requested access to the requested erase block. In this situation, however, the fuse set logic will not output a corresponding erase block address on the redirect erase block address bus 716 (ra<24:16>). The redirect enable signal 714 in combination with the fuse set logic 712 not outputting a redirect erase block address bus 716 signal effectively blocks all access, preventing inadvertent accessing of an erase block through two addresses.

It is noted that alternative manners of operating, accessing, and manufacturing non-volatile erase block memory devices utilizing embodiments of the present invention are possible and should be apparent to those skilled in the art with the benefit of the present disclosure.

CONCLUSION

An improved non-volatile erase block memory device apparatus and method has been described that incorporates an improved addressing scheme to provide for extended addressing allowing redundant erase blocks that are not utilized to repair general use erase blocks of the main memory array to be accessed and utilized as additional storage space by an end user. The additional storage space formed by the unused redundant erase blocks and the specified storage space of the main memory array is presented to the end user as a single contiguous address space. Additionally, the redundant erase blocks can be utilized to repair any damaged erase block in the memory array of the non-volatile erase block memory or Flash memory device regardless of bank placement.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of interfacing to an erase block memory array, comprising:
   accessing with an address interface an address range of a specified plurality of general use erase blocks of a memory array of a non-volatile erase block memory device of a specified size corresponding to the address range; and
   accessing with an extended address interface an extended address range of additional erase blocks of a plurality of additional erase blocks of the memory array of the non-volatile erase block memory device, wherein the extended address range of additional erase blocks and the address range of the specified plurality of general use erase blocks form one or more mutually exclusive ranges of user accessible general use addresses, and where the sum of the one or more mutually exclusive ranges of user accessible general use addresses are larger than the specified size of the non-volatile erase block memory device.

2. The method of claim 1, wherein accessing the extended address range of additional erase blocks with the extended address interface further comprises accessing at least one extended address line.

3. The method of claim 1, wherein accessing the extended address range of additional erase blocks with the extended address interface further comprises blocking access to one or more additional erase blocks of the memory array of the non-volatile erase block memory device that have been utilized to repair damaged erase blocks of the memory array.

4. The method of claim 1, wherein accessing the extended address range of additional erase blocks and the address range of general use erase blocks with the address interface and the extended address interface further comprises accessing the extended address range of unused additional erase blocks and the address range of general use erase blocks in a contiguous range of addresses.

5. A method of interfacing to an erase block memory array, comprising:
   accessing with an address interface an address range of a specified plurality of general use erase blocks of a memory array of a non-volatile erase block memory device of a specified size corresponding to the address range; and accessing with the address interface an extended address range of erase blocks of a plurality of redundant erase blocks of the memory array of the non-volatile erase block memory device, wherein the extended address range of redundant erase blocks and the address range of the specified plurality of general use erase blocks form one or more mutually exclusive ranges of user accessible general use addresses, and where the sum of the one or more mutually exclusive ranges of general use addresses is larger than the specified size of the non-volatile erase block memory device.

6. The method of claim 5, wherein accessing the extended address range of redundant erase blocks further comprises accessing the extended address range with an extended address interface.

7. The method of claim 5, wherein accessing the extended address range of redundant erase blocks further comprises blocking access to one or more redundant erase blocks of the memory array of the non-volatile erase block memory device that have been utilized to repair defective erase blocks of the memory array.

8. The method of claim 5, wherein accessing the extended address range of redundant erase blocks and the address range of general use erase blocks with the address interface further comprises accessing the extended address range of redundant erase blocks and the address range of general use erase blocks in a contiguous range of addresses.

9. The method of claim 5, wherein accessing the extended address range of redundant erase blocks and the address range of general use erase blocks with the address interface further comprises accessing a specified redundant erase block when a defective erase block is accessed and blocking access of the specified redundant erase block in the extended address range.

10. The method of claim 9, wherein accessing the extended address range of redundant erase blocks and the address range of general use erase blocks with the address interface and accessing a specified redundant erase block when a defective erase block is accessed and blocking access of the specified redundant erase block in the extended address range further comprises accessing the extended address range of redundant erase blocks and the address range of general use erase blocks in a contiguous range of addresses where the specified redundant erase block is selected from the end of the contiguous range of addresses.

11. A non-volatile erase block memory device interface, comprising:

an address interface, wherein the address interface enables access to an address range of a specified plurality of erase blocks of a non-volatile erase block memory device memory array of a specified size corresponding to the address range; and an extended address interface, wherein the extended address interface enables access to an extended address range of a plurality of additional erase blocks of the memory array of the non-volatile erase block memory device, wherein the extended address raune of the plurality of additional erase blocks and the address range of the specified plurality of erase blocks form one or more mutually exclusive ranges of user accessible general use addresses, and where the sum of the one or more mutually exclusive ranges of general use addresses is larger than the specified size of the non-volatile erase block memory device.

12. The non-volatile erase block memory device interface of claim 11, wherein the extended address interface further comprises at least one address line.

13. The non-volatile erase block memory device interface of claim 11, wherein the extended address interface is adapted to block access to additional erase blocks of the non-volatile erase block memory device that are utilized to repair damaged erase blocks of the memory array.

14. The non-volatile erase block memory device interface of claim 11, wherein the address range of the plurality of erase blocks and the extended address range of the plurality of additional erase blocks forms a unified contiguous address range.

15. The non-volatile erase block memory device interface of claim 11, wherein the non-volatile erase block memory device interface is adapted to repair erase blocks by redirecting an access to an erase block to a selected additional erase block and block access to the selected additional erase block through the extended address interface.

16. The non-volatile erase block memory device interface of claim 15, wherein the address range of the plurality of erase blocks and the extended address range of the plurality of additional erase blocks forms a unified contiguous address range and the selected additional erase block utilized to repair the damaged erase block is selected from the end of the contiguous address range.

17. The non-volatile erase block memory device interface of claim 11, wherein the additional erase blocks are redundant erase blocks addressed on a separate internal redundant erase block address bus.

* * * * *

UNITED STATES PATENT AND TRADEMARK OFFICE
CERTIFICATE OF CORRECTION

PATENT NO. : 7,154,782 B2
APPLICATION NO. : 11/207105
DATED : December 26, 2006
INVENTOR(S) : Vinod Lakhani and Benjamin Louie It is certified that error appears in the above-identified patent and that said Letters Patent is hereby corrected as shown below:

Column 5, line 40, replace "coupled an" with --coupled to an--.
Column 9, line 43, delete "(not shown)".
Column 16, line 10, replace "raune" with --range--.

Signed and Sealed this

Twenty-seventh Day of November, 2007

JON W. DUDAS
*Director of the United States Patent and Trademark Office*